(12) United States Patent
Liou et al.

(10) Patent No.: US 10,204,981 B2
(45) Date of Patent: Feb. 12, 2019

(54) SEMICONDUCTOR STRUCTURE AND MANUFACTURING METHOD THEREOF

(71) Applicant: United Microelectronics Corp., Hsinchu (TW)

(72) Inventors: En-Chiuan Liou, Tainan (TW); Yu-Cheng Tung, Kaohsiung (TW); Ching-Ling Lin, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/656,802

(22) Filed: Jul. 21, 2017

(65) Prior Publication Data
US 2019/0013381 A1    Jan. 10, 2019

(30) Foreign Application Priority Data
Jul. 6, 2017   (CN) .......................... 2017 1 0546404

(51) Int. Cl.
| | |
|---|---|
| *H01L 29/06* | (2006.01) |
| *H01L 29/78* | (2006.01) |
| *H01L 29/66* | (2006.01) |
| *H01L 21/762* | (2006.01) |

(52) U.S. Cl.
CPC .... *H01L 29/0638* (2013.01); *H01L 21/76237* (2013.01); *H01L 29/0649* (2013.01); *H01L 29/66803* (2013.01); *H01L 29/7851* (2013.01)

(58) Field of Classification Search
CPC ...................... H01L 21/76237; H01L 29/0638
See application file for complete search history.

(56) References Cited

U.S. PATENT DOCUMENTS

| | | | |
|---|---|---|---|
| 4,204,894 A | 5/1980 | Komeda et al. | |
| 5,976,939 A | 11/1999 | Thompson et al. | |
| 6,492,212 B1 | 12/2002 | Ieong et al. | |
| 7,224,029 B2 | 5/2007 | Anderson et al. | |
| 9,023,715 B2 | 5/2015 | Faul et al. | |
| 9,627,268 B2 | 4/2017 | Chang et al. | |
| 2015/0318377 A1* | 11/2015 | Cheng | H01L 29/0638 |
| | | | 257/349 |
| 2016/0056156 A1 | 2/2016 | Ghani et al. | |
| 2016/0181403 A1 | 6/2016 | Xu | |
| 2016/0211262 A1* | 7/2016 | Jan | H01L 21/823821 |
| 2017/0133457 A1* | 5/2017 | Zhu | H01L 29/0638 |

\* cited by examiner

*Primary Examiner* — Wael M Fahmy
*Assistant Examiner* — Sarah K Salerno
(74) *Attorney, Agent, or Firm* — J.C. Patents

(57) ABSTRACT

A semiconductor structure and a manufacturing method thereof are provided. The semiconductor structure includes a substrate, a first dielectric layer, a first doping layer of a first conductivity type, and a second doping layer of a second conductivity type. The substrate has a fin portion. The first dielectric layer is disposed on the substrate and surrounds the fin portion. The first doping layer of the first conductivity type is disposed on the first dielectric layer and is located on two opposite sidewalls of the fin portion. The second doping layer of the second conductivity type is disposed on the two opposite sidewalls of the fin portion and is located between the fin portion and the first doping layer. The first doping layer covers a sidewall and a bottom surface of the second doping layer.

9 Claims, 3 Drawing Sheets

SEMICONDUCTOR STRUCTURE AND MANUFACTURING METHOD THEREOF

CROSS REFERENCE TO RELATED APPLICATION

This application claims the priority benefits of China application serial no. 201710546404.4, filed on Jul. 6, 2017. The entirety of the above-mentioned patent application is hereby incorporated by reference herein and made a part of specification.

BACKGROUND OF THE INVENTION

Field of the Invention

The invention relates to a semiconductor structure and a manufacturing method thereof, particularly to a semiconductor structure in which doping layers of different conductivity types are disposed on a sidewall of a fin portion, and a manufacturing method of the semiconductor structure.

Description of Related Art

With rapid progress of semiconductor processing techniques, it has been necessary to continuously reduce dimensions of circuit elements and increase the integration of the elements in order to improve speed and performance of the elements. Currently, a three-dimensional multiple-gate structure such as a fin field-effect transistor (FinFET), for example, has been developed for replacing a complementary metal oxide semiconductor (CMOS) element. The FinFET has a fin portion extending vertically upward from a surface of a substrate and a gate disposed around the fin portion, thereby providing better electric control of a channel of the FinFET.

SUMMARY OF THE INVENTION

The invention provides a semiconductor structure, wherein doping layers of different conductivity types are disposed on a sidewall of a fin portion.

The invention provides a manufacturing method of a semiconductor structure, the manufacturing method being for manufacturing the aforementioned semiconductor structure.

The semiconductor structure of the invention includes a substrate, a first dielectric layer, a first doping layer of a first conductivity type, and a second doping layer of a second conductivity type. The substrate has a fin portion. The first dielectric layer is disposed on the substrate and surrounds the fin portion. The first doping layer of the first conductivity type is disposed on the first dielectric layer and is located on two opposite sidewalls of the fin portion. The second doping layer of the second conductivity type is disposed on the two opposite sidewalls of the fin portion and is located between the fin portion and the first doping layer. The first doping layer covers a sidewall and a bottom surface of the second doping layer.

In an embodiment of the semiconductor structure of the invention, top surfaces of the first doping layer and the second doping layer are lower than a top surface of the fin portion.

In an embodiment of the semiconductor structure of the invention, a second dielectric layer disposed on the first dielectric layer and surrounding the first doping layer is further included, wherein top surfaces of the first doping layer, the second doping layer and the second dielectric layer are coplanar.

In an embodiment of the semiconductor structure of the invention, the first doping layer extends over the first dielectric layer.

In an embodiment of the semiconductor structure of the invention, a second dielectric layer disposed on the first doping layer is further included, wherein top surfaces of the first doping layer, the second doping layer and the second dielectric layer are coplanar.

The manufacturing method of a semiconductor structure of the invention includes the following steps. A substrate having a fin portion is provided. A first dielectric layer is formed on the substrate, the first dielectric layer surrounding the fin portion. A first doping layer of a first conductivity type is forming on the first dielectric layer, wherein the first doping layer is located on two opposite sidewalls of the fin portion. A second doping layer of a second conductivity type is foil led on the two opposite sidewalls of the fin portion, wherein the second doping layer is located between the fin portion and the first doping layer. The first doping layer covers a sidewall and a bottom surface of the second doping layer.

In an embodiment of the manufacturing method of a semiconductor structure of the invention, top surfaces of the first doping layer and the second doping layer are lower than a top surface of the fin portion.

In an embodiment of the manufacturing method of a semiconductor structure of the invention, the following step is further included. A second dielectric layer is formed on the first dielectric layer, wherein the second dielectric layer surrounds the first doping layer, and top surfaces of the first doping layer, the second doping layer and the second dielectric layer are coplanar.

In an embodiment of the manufacturing method of a semiconductor structure of the invention, the first doping layer extends over the first dielectric layer.

In an embodiment of the manufacturing method of a semiconductor structure of the invention, the following step is further included. A second dielectric layer is formed on the first doping layer, wherein top surfaces of the first doping layer, the second doping layer and the second dielectric layer are coplanar.

Based on the above, in the semiconductor structure of the invention, the doping layers of different conductivity types are disposed on the sidewall of the fin portion, and the doping layer of the first conductivity type covers the sidewall and the bottom surface of the doping layer of the second conductivity type. Therefore, when the semiconductor structure of the invention serves as a substrate of a FinFET, the doping layer of the first conductivity type may serve as a barrier layer to prevent a leakage current from flowing into the substrate.

To make the above features and advantages of the invention more comprehensible, embodiments accompanied with drawings are described in detail as follows.

DETAILED DESCRIPTION OF DISCLOSED EMBODIMENTS

Figure 1A:
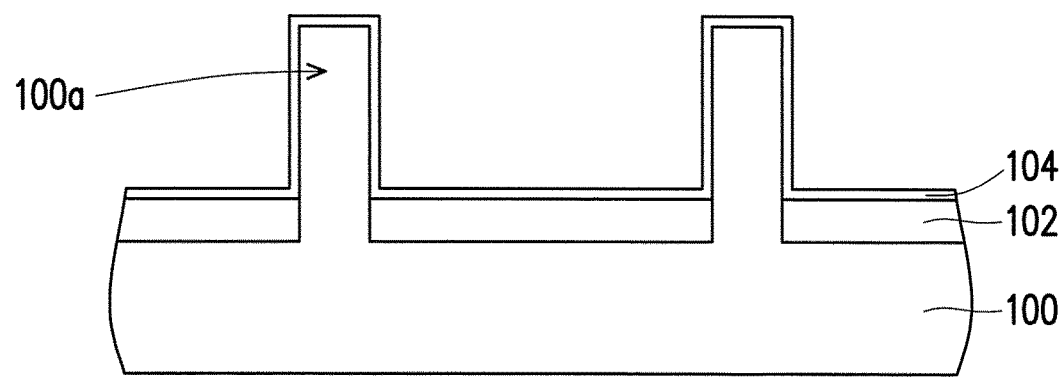
FIGS. 1A to 1D are schematic cross-sectional views of a manufacturing process of a semiconductor structure according to a first embodiment of the invention.

FIGS. 1A to 1D are schematic cross-sectional views of a manufacturing process of a semiconductor structure according to a first embodiment of the invention. First of all, referring to FIG. 1A, a substrate 100 having a fin portion 100a is provided. The fin portion 100a is, for example, formed by performing a patterning process on the bulk substrate 100. In an embodiment, firstly, a patterned hard mask layer (not illustrated) is formed on the substrate 100, and then an anisotropic etching process is performed using the patterned hard mask layer as an etching mask, so as to remove a portion of the substrate 100 to form the fin portion 100a. In this case, the patterned hard mask layer may remain on a top surface of the fin portion 100a in subsequent processes, and the patterned hard mask layer may be removed from the top surface of the fin portion 100a at suitable timing according to actual needs. In FIG. 1A, the number of the fin portion 100a is only for exemplary purposes and the invention is not thereby limited. In addition, according to actual needs, the height and width of the fin portion 100a may be adjusted.

Then, a dielectric layer 102 surrounding the fin portion 100a is formed on the substrate 100. The dielectric layer 102 is, for example, an oxide layer. In the present embodiment, the dielectric layer 102 covers a lower portion of each fin portion 100a. A method for forming the dielectric layer 102 is, for example, as follows. Firstly, a dielectric material layer is formed on the substrate 100, and then an etch-back process is performed on the dielectric material layer, so as to remove a portion of the dielectric material layer to expose an upper portion of the fin portion 100a. Next, a doping layer 104 is formed on the substrate 100. The doping layer 104 is a dielectric layer containing a P-type dopant or an N-type dopant. The dielectric layer is, for example, an oxide layer, a nitride layer or a carbide layer. The doping layer 104 may be formed by a chemical vapor deposition (CVD) process, an atomic layer deposition (ALD) process or the like. In the present embodiment, the doping layer 104 is, for example, borosilicate glass (BSG). The doping layer 104 is conformally formed on the substrate 100 so as to cover the whole fin portion 100a and a top surface of the dielectric layer 102.

The doping layer 104 is configured to dope the fin portion 100a so as to change the conductivity type of the fin portion 100a. For example, after the doping layer 104 is formed on the substrate 100, an annealing process may be performed to cause the P-type dopant or the N-type dopant in the doping layer 104 to diffuse into the fin portion 100a. However, the invention is not limited thereto. In other embodiments, the annealing process may be performed at other time points according to actual needs.

Figure 1B:
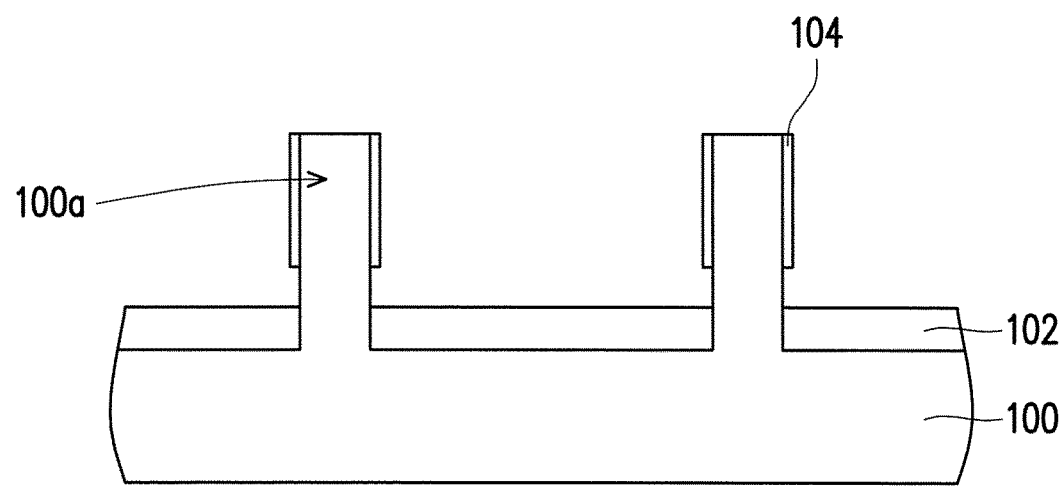

Then, referring to FIG. 1B, an etching process is performed to remove the doping layer 104 on the top surface of the fin portion 100a and the doping layer 104 on the top surface of the dielectric layer 102, and the doping layer 104 located on two opposite sidewalls of the fin portion 100a remains. The etching process is, for example, a dry etching process. Next, an etch-back process is performed to remove a portion of the dielectric layer 102, thereby reducing the thickness of the dielectric layer 102. After the portion of the dielectric layer 102 is removed, a portion of the sidewalls of the fin portion 100a is exposed.

Figure 1C:
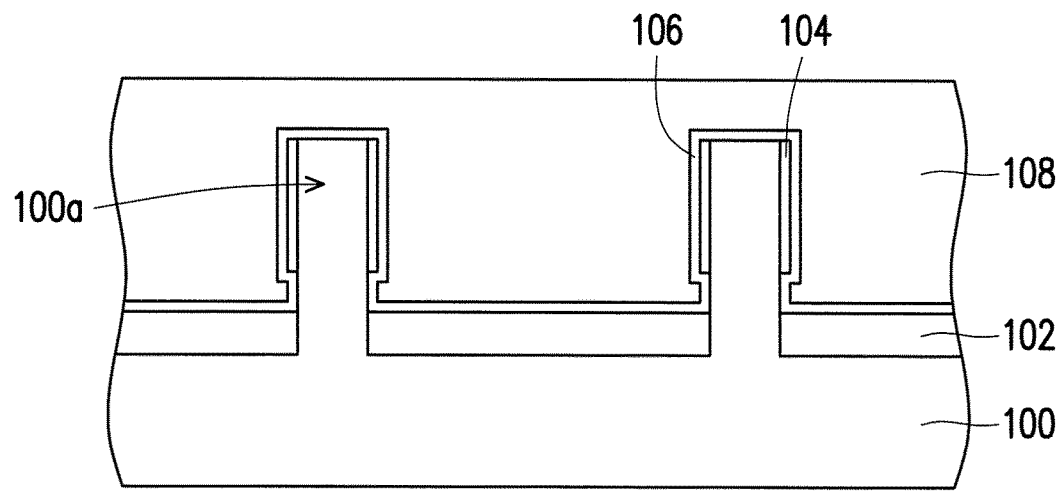

Next, referring to FIG. 1C, a doping layer 106 is formed on the substrate 100. The doping layer 106 is a dielectric layer containing a dopant of a conductivity type opposite that of the doping layer 104. The dielectric layer is, for example, an oxide layer, a nitride layer or a carbide layer. The doping layer 106 may be formed by a CVD process, an ALD process or the like. In the present embodiment, the doping layer 104 is, for example, BSG, and thus the doping layer 106 may be phosphosilicate glass (PSG) of the opposite conductivity type. The doping layer 106 is conformally formed on the substrate 100 so as to cover the dielectric layer 102, the exposed portion of the fin portion 100a and the doping layer 104. Then, a dielectric layer 108 is formed on the doping layer 106. The dielectric layer 108 covers the whole fin portion 100a and the layers formed thereon.

Figure 1D:
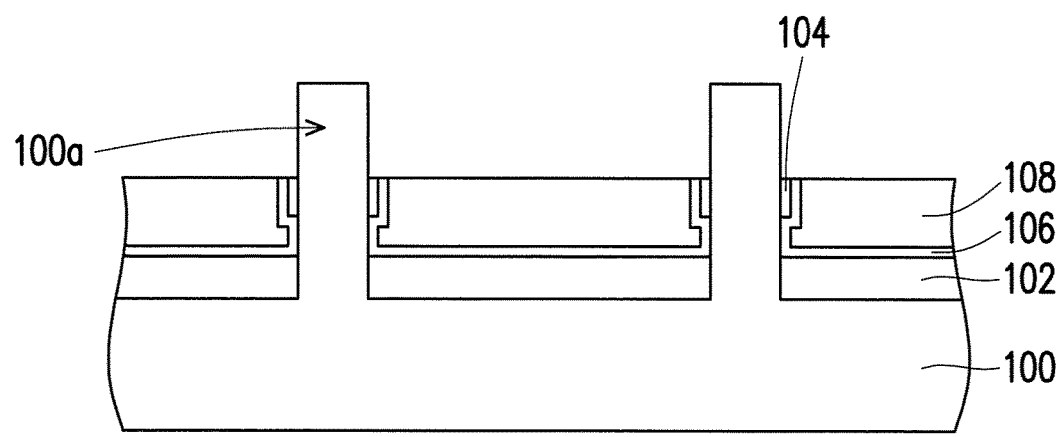

Then, referring to FIG. 1D, an etch-back process is performed to remove a portion of the dielectric layer 108, a portion of the doping layer 106 and a portion of the doping layer 104, so that top surfaces of the dielectric layer 108, the doping layer 106 and the doping layer 104 are all lower than the top surface of the fin portion 100a. In the present embodiment, the top surfaces of the dielectric layer 108, the doping layer 106 and the doping layer 104 are coplanar. However, the invention is not limited thereto. After the portion of the dielectric layer 108, the portion of the doping layer 106 and the portion of the doping layer 104 are removed, the thus formed structure may serve as a substrate for use in manufacturing a fin field-effect transistor (FinFET). For example, a gate dielectric layer may subsequently be conformally formed on surfaces of the dielectric layer 108, the doping layer 106, the doping layer 104 and the exposed fin portion 100a, and a conductive layer may be formed on the gate dielectric layer to serve as a gate of the FinFET. The aforementioned manufacturing process is well known to persons skilled in the art and will not be described in detail herein.

In the present embodiment, after the etch-back process described in FIG. 1D is performed, the doping layer 104 remains on the two opposite sidewalls of the fin portion 100a. A sidewall and a bottom surface of the doping layer 104 are covered by the doping layer 106, i.e., the doping layer 104 is located between the fin portion 100a and the doping layer 106. Since the doping layer 104 and the doping layer 106 are of opposite conductivity types, after the dopant in the doping layer 104 diffuses into the fin portion 100a, the fin portion 100a and the doping layer 106 will have opposite conductivity types. In this way, after the FinFET is formed as above, during operation of the FinFET, the doping layer 106 may serve as a barrier layer to prevent a leakage current from flowing into the substrate 100.

In addition, in the present embodiment, the doping layer 106 is not only located on the sidewalls of the fin portion 100a but also extends over the top surface of the dielectric layer 102. However, the invention is not limited thereto. In other embodiments, the doping layer 106 may only be located on the sidewalls of the fin portion 100a and does not extend over the top surface of the dielectric layer 102. Details thereof are described as follows.

Figure 2A:
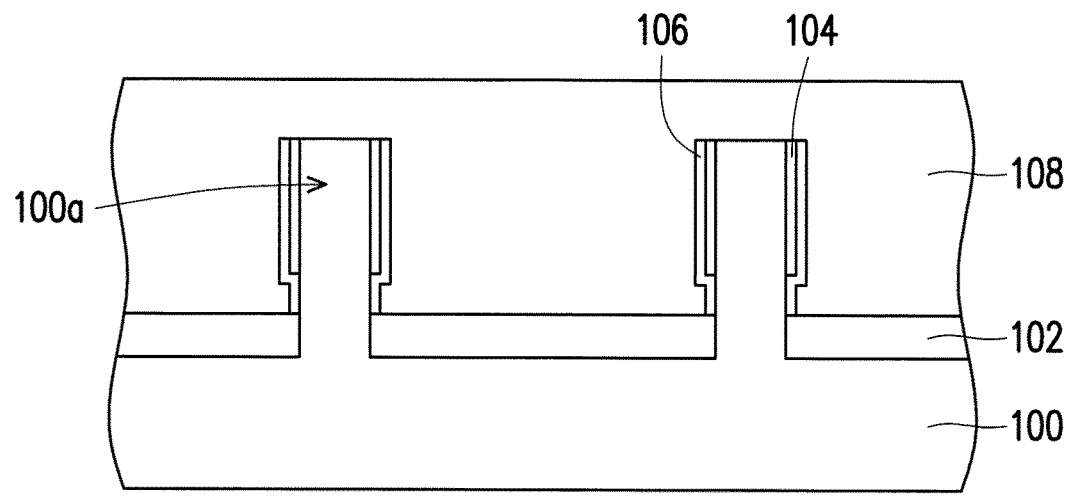
FIGS. 2A to 2B are schematic cross-sectional views of a manufacturing process of a semiconductor structure according to a second embodiment of the invention.
Figure 2B:
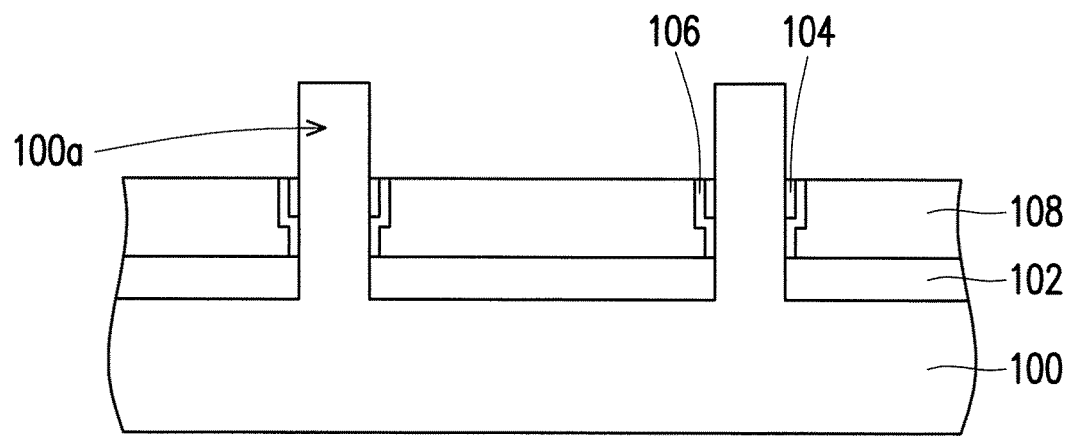

FIGS. 2A to 2B are schematic cross-sectional views of a manufacturing process of a semiconductor structure according to a second embodiment of the invention. In the present embodiment, the same elements as those in FIGS. 1A to 1D will be denoted by the same reference numerals and descriptions thereof will be omitted herein.

First of all, referring to FIG. 2A, after the step of forming the doping layer 106 as in FIG. 1C is performed, an etch-back process is performed to remove the doping layer 106 on the top surface of the fin portion 100a and the doping layer 106 on the top surface of the dielectric layer 102, and only the doping layer 106 on the sidewalls of the fin portion 100a remains. Then, the dielectric layer 108 is formed on the dielectric layer 102. The dielectric layer 108 covers the whole fin portion 100a and the layers formed thereon.

Then, referring to FIG. 2B, the step as described in FIG. 1D is performed to remove a portion of the dielectric layer 108, a portion of the doping layer 106 and a portion of the doping layer 104, so that the top surfaces of the dielectric layer 108, the doping layer 106 and the doping layer 104 are all lower than the top surface of the fin portion 100a. In the present embodiment, the top surfaces of the dielectric layer 108, the doping layer 106 and the doping layer 104 are coplanar. However, the invention is not limited thereto. Similarly to the first embodiment, after the portion of the dielectric layer 108, the portion of the doping layer 106 and the portion of the doping layer 104 are removed, the thus formed structure may serve as a substrate for use in manufacturing a FinFET.

In the present embodiment, the doping layer 104 remains on the two opposite sidewalls of the fin portion 100a. Moreover, the sidewall and the bottom surface of the doping layer 104 are covered by the doping layer 106, i.e., the doping layer 104 is located between the fin portion 100a and the doping layer 106. Since the doping layer 104 and the doping layer 106 are of opposite conductivity types, after the dopant in the doping layer 104 diffuses into the fin portion 100a, the fin portion 100a and the doping layer 106 will have opposite conductivity types. In this way, during operation of the subsequently formed FinFET, the doping layer 106 may serve as the barrier layer to prevent a leakage current from flowing into the substrate 100.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A semiconductor structure, comprising:
a substrate, having a fin portion;
a first dielectric layer, disposed on the substrate and surrounding the fin portion;
a first doping layer of a first conductivity type, disposed on the first dielectric layer and located on two opposite sidewalls of the fin portion; and
a second doping layer of a second conductivity type, disposed on the two opposite sidewalls of the fin portion and located between the fin portion and the first doping layer,
wherein the first doping layer covers a sidewall and a bottom surface of the second doping layer,
wherein a portion of the first doping layer on the two opposite sidewalls of the fin portion comprises a lower part and an upper part, wherein the lower part is directly disposed on the two opposite sidewalls of the fin portion, and the upper portion covers the second doping layer.

2. The semiconductor structure according to claim 1, wherein top surfaces of the first doping layer and the second doping layer are lower than a top surface of the fin portion.

3. The semiconductor structure according to claim 1, further comprising a second dielectric layer disposed on the first dielectric layer and surrounding the first doping layer, wherein top surfaces of the first doping layer, the second doping layer and the second dielectric layer are coplanar.

4. A semiconductor structure, comprising:
a substrate, having a fin portion;
a first dielectric layer, disposed on the substrate and surrounding the fin portion;
a first doping layer of a first conductivity type, disposed on the first dielectric layer and located on two opposite sidewalls of the fin portion;
a second doping layer of a second conductivity type, disposed on the two opposite sidewalls of the fin portion and located between the fin portion and the first doping layer; and
a second dielectric layer disposed on the first doping layer, wherein top surfaces of the first doping layer, the second doping layer and the second dielectric layer are coplanar,
wherein the first doping layer covers a sidewall and a bottom surface of the second doping layer and extends over the first dielectric layer.

5. A manufacturing method of a semiconductor structure, comprising:
providing a substrate, the substrate having a fin portion;
forming a first dielectric layer on the substrate, the first dielectric layer surrounding the fin portion;
forming a first doping layer of a first conductivity type on the first dielectric layer, wherein the first doping layer is located on two opposite sidewalls of the fin portion; and
forming a second doping layer of a second conductivity type on the two opposite sidewalls of the fin portion, wherein the second doping layer is located between the fin portion and the first doping layer,
wherein the first doping layer covers a sidewall and a bottom surface of the second doping layer,
wherein in the step of forming the first doping layer, a portion of the first doping layer on the two opposite sidewalls of the fin portion comprises a lower part and an upper part, wherein the lower part is directly disposed on the two opposite sidewalls of the fin portion, and the upper portion covers the second doping layer.

6. The manufacturing method of a semiconductor structure according to claim 5, wherein top surfaces of the first doping layer and the second doping layer are lower than a top surface of the fin portion.

7. The manufacturing method of a semiconductor structure according to claim 5, further comprising forming a second dielectric layer on the first dielectric layer, wherein the second dielectric layer surrounds the first doping layer, and top surfaces of the first doping layer, the second doping layer and the second dielectric layer are coplanar.

8. The manufacturing method of a semiconductor structure according to claim 5, wherein the first doping layer extends over the first dielectric layer.

9. The manufacturing method of a semiconductor structure according to claim 8, further comprising forming a second dielectric layer on the first doping layer, wherein top surfaces of the first doping layer, the second doping layer and the second dielectric layer are coplanar.

* * * * *